US010249320B2

(12) United States Patent
Aaron et al.

(10) Patent No.: US 10,249,320 B2
(45) Date of Patent: Apr. 2, 2019

(54) NORMALIZING THE SPEAKING VOLUME OF PARTICIPANTS IN MEETINGS

(71) Applicant: International Business Machines Corporation, Armonk, NY (US)

(72) Inventors: Andrew Aaron, Ardsley, NY (US); Shang Q. Guo, Cortlandt Manor, NY (US); Jonathan Lenchner, North Salem, NY (US); Maharaj Mukherjee, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 243 days.

(21) Appl. No.: 15/276,037

(22) Filed: Sep. 26, 2016

(65) Prior Publication Data
US 2018/0090154 A1    Mar. 29, 2018

(51) Int. Cl.
*G10L 19/00* (2013.01)
*G10L 21/034* (2013.01)
(Continued)

(52) U.S. Cl.
CPC ............ *G10L 21/034* (2013.01); *G10L 25/21* (2013.01); *G10L 25/51* (2013.01); *H03G 3/3005* (2013.01);
(Continued)

(58) Field of Classification Search
None
See application file for complete search history.

(56) References Cited

U.S. PATENT DOCUMENTS 6,169,807 B1 * 1/2001 Sansur .................... H03G 3/32
                                                        381/107
7,392,066 B2 * 6/2008 Haparnas ............ H04M 19/044
                                                        379/373.01
(Continued)

OTHER PUBLICATIONS

Peter Mell et al. Recommendations of the National Institute of Standards and Technology, The NIST Definition of Computing, NIST National Institute of Standard Technology U.S. Department of Commerce, Special Publication 800-145, Sep. 2011.
(Continued)

*Primary Examiner* — Satwant K Singh
(74) *Attorney, Agent, or Firm* — Ryan, Mason & Lewis, LLP (57) ABSTRACT

Methods, systems, and computer program products for normalizing the speaking volume of participants in meetings are provided herein. A computer-implemented method includes collecting speaking volume samples from multiple participants of a group event, wherein said speaking volume samples are derived from microphones; comparing said speaking volume samples to a predetermined volume level; determining which of the microphones is being used by which of the multiple participants during the group event; automatically amplifying a broadcast volume of each audio output device during periods of audio input attributed to each microphone determined as being used by the participants attributed to a speaking volume sample that is below the predetermined volume level; and automatically reducing a broadcast volume of each audio output device during periods of audio input attributed to each microphone determined as being used by the participants attributed to a speaking volume sample that exceeds the predetermined volume level.

19 Claims, 5 Drawing Sheets

(51) Int. Cl.
*G10L 25/51* (2013.01)
*H03G 3/30* (2006.01)
*G10L 25/21* (2013.01)
*H04L 29/06* (2006.01)
*H04L 12/18* (2006.01)
*H04M 3/56* (2006.01)

(52) U.S. Cl.
CPC ........ *H04L 12/1827* (2013.01); *H04L 65/403* (2013.01); *H04M 3/568* (2013.01)

(56) References Cited

U.S. PATENT DOCUMENTS

| | | | | |
|---|---|---|---|---|
| 8,325,639 | B2* | 12/2012 | Kotera | H04L 12/66 |
| | | | | 370/311 |
| 9,344,821 | B2* | 5/2016 | Emery | G10L 15/30 |
| 9,735,747 | B2* | 8/2017 | Rider | H03G 3/3005 |
| 9,779,761 | B2* | 10/2017 | Emery | G10L 15/30 |
| 2012/0275620 | A1* | 11/2012 | Matsuo | H04R 3/005 |
| | | | | 381/92 |
| 2016/0255126 | A1* | 9/2016 | Sarris | H04L 65/1096 |
| | | | | 348/14.08 |
| 2018/0025742 | A1* | 1/2018 | Emery | G10L 15/30 |
| | | | | 704/270 |

OTHER PUBLICATIONS

Wikipedia, Automatic Gain Control, https://en.wikipedia.org/wiki/Automatic_gain_control, Jun. 9, 2016.

* cited by examiner

NORMALIZING THE SPEAKING VOLUME OF PARTICIPANTS IN MEETINGS

FIELD

The present application generally relates to information technology, and, more particularly, to audio optimization technology.

BACKGROUND

In meetings that are conducted via telephone and/or over one or more audio channels, there can be one or more participants that speak with a relatively soft voice, and it is therefore difficult for other participants to hear them. It can be similarly difficult to hear such participants, for example, when such participants are relatively far from the closest microphone. Additionally, challenges can arise from participants that speak in an overly loud voice.

SUMMARY

In one embodiment of the present invention, techniques for normalizing the speaking volume of participants in meetings are provided. An exemplary computer-implemented method can include collecting speaking volume samples from multiple participants of a group event, wherein said speaking volume samples are derived from one or more microphones being used during the group event. Such a method can also include comparing said speaking volume samples to a predetermined volume level, wherein said predetermined volume level is based on one or more volume models, and determining which of the one or more microphones is being used by which of the multiple participants during the group event. Additionally, such a method can include automatically amplifying a broadcast volume of each audio output device being used in the group event during periods of audio input attributed to each microphone determined as being used by the participants attributed to a speaking volume sample that is below the predetermined volume level by more than a given threshold. Further, such a method can include automatically reducing a broadcast volume of each audio output device being used in the group event during periods of audio input attributed to each microphone determined as being used by the participants attributed to a speaking volume sample that exceeds the predetermined volume level by more than the given threshold.

Another embodiment of the invention or elements thereof can be implemented in the form of a computer program product tangibly embodying computer readable instructions which, when implemented, cause a computer to carry out a plurality of method steps, as described herein. Furthermore, another embodiment of the invention or elements thereof can be implemented in the form of a system including a memory and at least one processor that is coupled to the memory and configured to perform noted method steps.

These and other objects, features and advantages of the present invention will become apparent from the following detailed description of illustrative embodiments thereof, which is to be read in connection with the accompanying drawings.

DETAILED DESCRIPTION

As described herein, an embodiment of the present invention includes implementing an intelligent pre-sampling microphone and/or microphone array for normalizing and/or equalizing the speaking volume of participants in meetings. At least one embodiment of the invention includes periodically sampling the volume of all speakers within a meeting, and implementing amplifying microphones to dynamically amplify the volume of softly speaking participants and reducing the volume of loudly speaking participants. As further detailed herein, volumes can be reduced or amplified so that they reach the mean volume as measured on the current call, or based on historical calls.

Volume controlling, in at least one embodiment of the invention, can be carried out by a remote central server, while the audio output devices (for example, the microphones or speakers) are software-controllable. Note, also, that most of today's microphones are purely sound input devices and do not, by themselves, have the ability to output sound. In such a scenario, volume controlling would be carried out via separate software-controllable speakers.

In one or more separate embodiments of the invention, a remote central server would not be utilized for volume controlling, but decisions about volume control would be carried out via peer-to-peer communication among smart microphones and smart speakers. For example, each audio output device can obtain the volumes of all microphones, determine the mean and standard deviations of said volumes, and then use these values to determine how much to increase or decrease the volume of an utterance emanating from a given microphone or user of a given microphone.

Additionally, one or more embodiments of the invention can include learning one or more speaking volume characteristics of a given speaker for use in subsequent iterations of the invention and/or subsequent meetings. Such an embodiment can include recognizing the given user in a subsequent iteration and/or meeting, and automatically applying a selective amplification to the given user before and/or without sampling the given user in the course of the particular meeting. Such recognition can be carried out, for example, via the use of one or more speaker recognition techniques. Alternatively, one or more embodiments of the invention can include incorporating the use of cameras, and using the cameras to perform face recognition in combination with voice recognition techniques.

At least one embodiment of the invention can also be implemented in a scenario wherein two or more people share the same microphone in a meeting. Such an embodiment can include utilizing sensing technology to determine when each of the individuals sharing the microphone is speaking. For example, speaker recognition technology can be utilized if the speaker is already known. If the speaker is not already known, one or more embodiments of the invention can include determining whether modeling the speech signal as if the signal were coming from a single speaker or multiple speakers gives a tighter model (that is, generates less variance for each phoneme).

Subsequent to such a determination among multiple individuals sharing a microphone, dynamic speaking volume amplification and/or reduction techniques can be carried out in connection with each of the individuals sharing the microphone. If using solely audio signaling, at least one embodiment of the invention can include implementing volume controls in conjunction with a time delay in the case of multiple speakers speaking from the same microphone. Alternatively, one or more embodiments of the invention can include implementing one or more video sensors (cameras) such that volume controls made in the context of multiple speakers speaking from the same microphone can be made just as the person is about to speak using face recognition techniques in conjunction with video recognition that the given person is about to speak into the given microphone.

One or more embodiments of the invention can additionally include detecting when a participant previously determined to be a softly speaking participant and/or low-volume speaker is speaking, and automatically reducing the volume of the microphones of the participants in the meeting previously determined to be high-volume speakers. In the event that it is one speaker per microphone (and no cameras are being utilized), at least one embodiment of the invention can recognize the low-volume speaker after the dynamic equalization techniques have been applied to all participants by recognizing that the expected microphone is being used.

Also, one or more embodiments of the invention can include identifying and compensating for extraneous and/or persistent background noise. For example, a participant on a teleconference and/or telephone meeting might be participating from a train or car, or the participant might simply be typing on a computer during a meeting (with the sound of the typing being audible and captured by the microphone(s)). Alternatively, such an embodiment can include detecting (for example, via an array of microphones and/or sensors outfitted on the participant's phone) the incoming extraneous and/or background noise as diffuse rather than emanating from a localized source. A microphone array can be used to detect differences in time of flight among different audio signals, and to (optionally) separate such signals (for example, if two people are speaking at the same time). If sound is coming from many sources, such sound can include background noise and that can be muted. Additionally, an array of microphones can be used to perform selective noise cancellation (for example, cancellation of the undesirable diffuse source).

Additionally, at least one embodiment of the invention can include coordinating actions across multiple pre-sampling microphones through a common server. Such coordinated actions can include, for example, collecting the natural (unmodified) broadcast volumes of the respective speakers, and determining the selective elevating or lowering of broadcast volume levels for the speakers.

Figure 1:
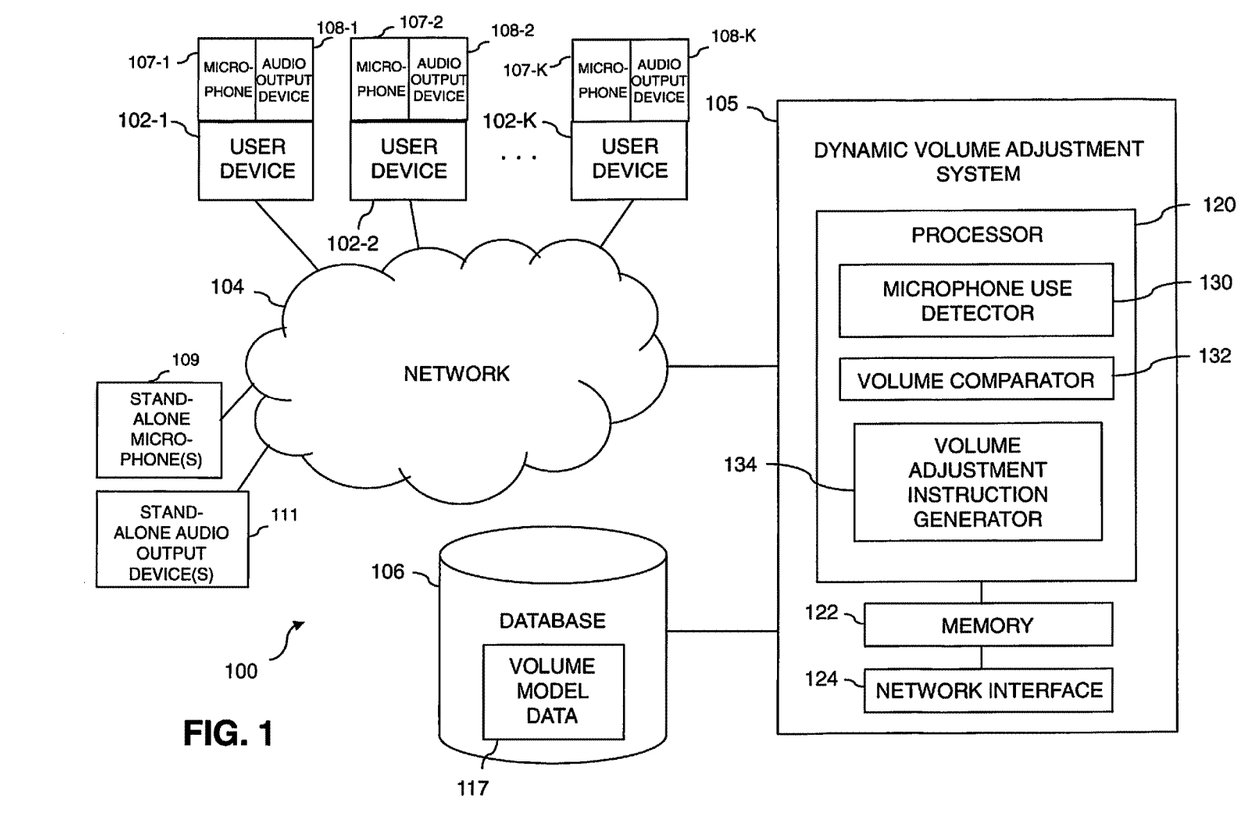
FIG. 1 is a diagram illustrating system architecture, according to an exemplary embodiment of the invention.

FIG. 1 is a diagram illustrating the system architecture, according to an exemplary embodiment of the invention. By way of illustration, FIG. 1 depicts a computer network 100 configured in accordance with an illustrative embodiment of the invention. The computer network 100 comprises a plurality of user devices 102-1, 102-2, . . . 102-K, collectively referred to herein as user devices 102. Each user device (102-1, 102-2 . . . 102-K) includes a microphone (107-1, 107-2 . . . 107-K, collectively referred to herein as microphones 107) as well as an audio output device (108-1, 108-2 . . . 108-K, collectively referred to herein as audio output devices 108) such as a speaker. Additionally, the computer network 100 can also comprise one or more stand-alone microphones 109 and one or more stand-alone audio output devices 111, which function similarly to microphones 107 and audio output devices 108, respectively, but in independent forms that are not connected to nor resident on a user device 102.

The user devices 102, stand-alone microphones 109, and stand-alone audio output devices 111 are coupled to a network 104, where the network 104 in this embodiment is assumed to represent a sub-network or other related portion of the larger computer network 100. As also detailed herein, in one or more embodiments of the invention, the network 104 can include a network that facilitates peer-to-peer communication among the user devices 102. Accordingly, elements 100 and 104 are both referred to herein as examples of "networks" but the latter is assumed to be a component of the former in the context of the FIG. 1 embodiment. Also coupled to the network 104 is a dynamic volume adjustment system 105. Alternatively, in one or more separate embodiments of the invention, a separate dynamic volume adjustment system 105 would not be utilized, but decisions about volume control would be carried out via peer-to-peer communication among the user devices 102.

As detailed herein, an example embodiment of the invention can include taking audio input from each user through the corresponding microphone 107 of the relevant user device 102 (or through a particular stand-alone microphone 109), and providing a modified and/or normalized audio output for each user at the volume-controlled audio output device 108 at their user device 102 (and at each stand-alone audio output device 111).

The user devices 102 may comprise, for example, mobile telephones, laptop computers, tablet computers, desktop computers or other types of devices supporting audio recording and/or transmission capabilities. Such devices are examples of what are more generally referred to herein as "processing devices." Some of these processing devices are also generally referred to herein as "computers."

The user devices 102 in some embodiments comprise respective computers associated with a particular company, organization or other enterprise. In addition, at least portions of the computer network 100 may also be referred to herein as collectively comprising an "enterprise network." Numerous other operating scenarios involving a wide variety of different types and arrangements of processing devices and networks are possible, as will be appreciated by those skilled in the art.

Also, it is to be appreciated that the term "user" in this context and elsewhere herein is intended to be broadly construed so as to encompass, for example, human, hardware, software or firmware entities, as well as various combinations of such entities.

The network 104 is assumed to comprise a portion of a global computer network such as the Internet, although other types of networks can be part of the computer network 100, including a wide area network (WAN), a local area network (LAN), a satellite network, a telephone or cable network, a cellular network, a wireless network such as a Wi-Fi or WiMAX network, or various portions or combinations of these and other types of networks. The computer network 100 in some embodiments therefore comprises combinations of multiple different types of networks each comprising processing devices configured to communicate using internet protocol (IP) or other related communication protocols.

The dynamic volume adjustment system 105 has an associated database 106 configured to store volume model data 117. The database 106 in the present embodiment is implemented using one or more storage systems associated with the dynamic volume adjustment system 105. Such storage systems can comprise any of a variety of different types of storage including network-attached storage (NAS), storage area networks (SANs), direct-attached storage (DAS) and distributed DAS, as well as combinations of these and other storage types, including software-defined storage.

The dynamic volume adjustment system 105 in the FIG. 1 embodiment is assumed to be implemented using at least one processing device. Each such processing device generally comprises at least one processor and an associated memory, and implements one or more functional modules for controlling certain features of the dynamic volume adjustment system 105. More particularly, the dynamic volume adjustment system 105 in this embodiment comprises a processor 120 coupled to a memory 122 and a network interface 124.

The processor 120 illustratively comprises a microprocessor, a microcontroller, an application-specific integrated circuit (ASIC), a field-programmable gate array (FPGA) or other type of processing circuitry, as well as portions or combinations of such circuitry elements.

The memory 122 illustratively comprises random access memory (RAM), read-only memory (ROM) or other types of memory, in any combination. The memory 122 and other memories disclosed herein may be viewed as examples of what are more generally referred to as "processor-readable storage media" storing executable computer program code or other types of software programs.

One or more embodiments of the invention include articles of manufacture, such as computer-readable storage media. Examples of an article of manufacture include, without limitation, a storage device such as a storage disk, a storage array or an integrated circuit containing memory, as well as a wide variety of other types of computer program products. The term "article of manufacture" as used herein should be understood to exclude transitory, propagating signals.

The network interface 124 allows the dynamic volume adjustment system 105 to communicate over the network 104 with the user devices 102, and illustratively comprises one or more conventional transceivers. The processor 120 further comprises a microphone use detector 130, a volume comparator 132, and a volume adjustment instruction generator 134.

It is to be appreciated that this particular arrangement of modules 130, 132, and 134 illustrated in the processor 120 of the FIG. 1 embodiment is presented by way of example only, and alternative arrangements can be used in other embodiments. For example, the functionality associated with the modules 130, 132, and 134 in other embodiments can be combined into a single module, or separated across a larger number of modules. As another example, multiple distinct processors can be used to implement different ones of the modules 130, 132, and 134 or portions thereof.

At least portions of the microphone use detector 130, volume comparator 132, and volume adjustment instruction generator 134 may be implemented at least in part in the form of software that is stored in memory 122 and executed by processor 120.

It is to be understood that the particular set of elements shown in FIG. 1 for automatically normalizing and/or equalizing speaking volumes within a meeting involving user devices 102 of computer network 100 is presented by way of illustrative example only, and in other embodiments additional or alternative elements may be used. Thus, another embodiment may include additional or alternative systems, devices and other network entities, as well as different arrangements of modules and other components.

By way of example, in other embodiments, the dynamic volume adjustment system 105 can be eliminated and associated elements such as microphone use detector 130, volume comparator 132, and volume adjustment instruction generator 134 can be implemented elsewhere in the computer network 100.

An exemplary process utilizing microphone use detector 130, volume comparator 132, and volume adjustment instruction generator 134 of the dynamic volume adjustment system 105 in computer network 100 will be described in more detail with reference to the flow diagram of FIG. 2.

Figure 2:
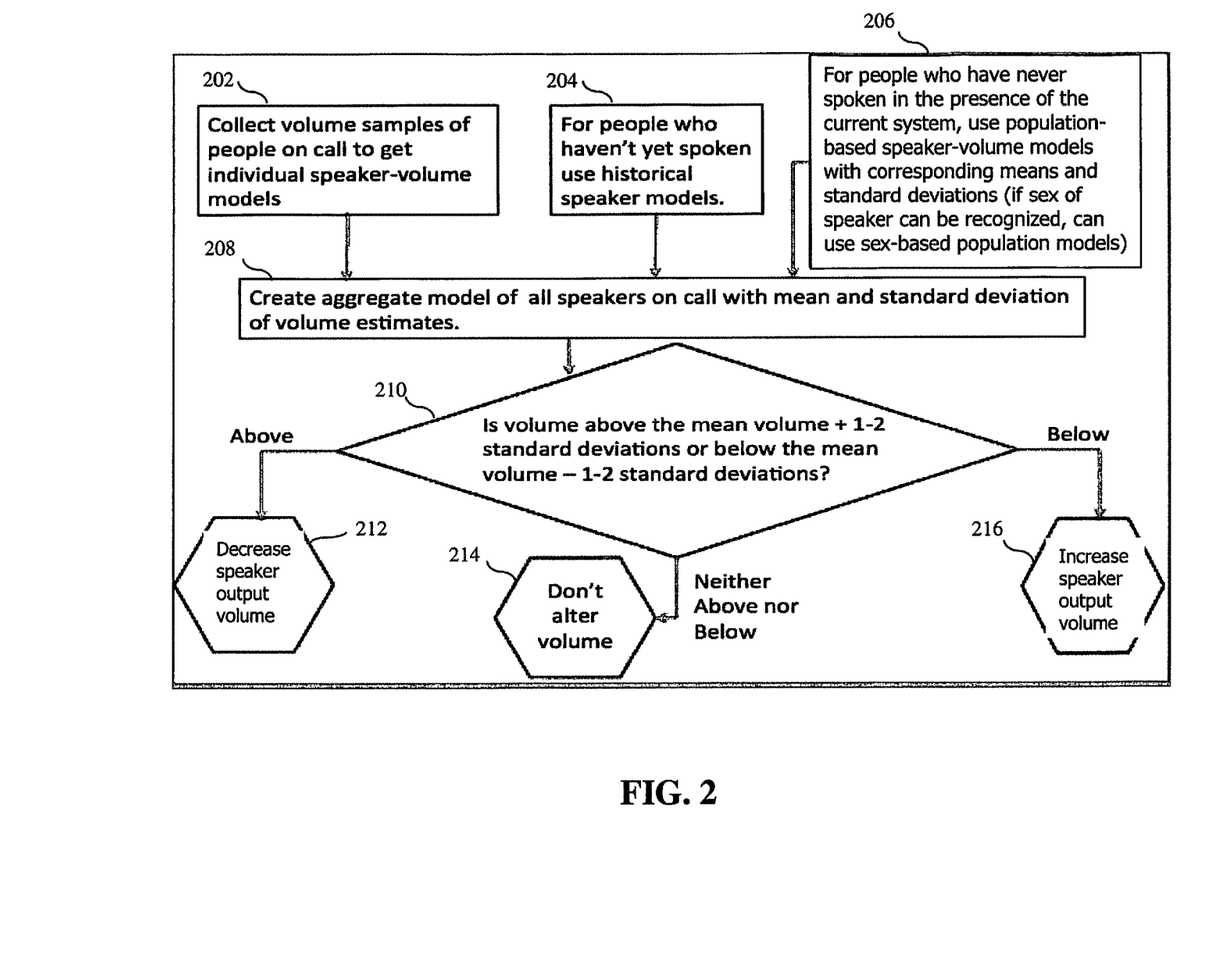
FIG. 2 is a flow diagram illustrating techniques according to an embodiment of the invention.

FIG. 2 is a flow diagram illustrating techniques according to an embodiment of the present invention. Step 202 includes collecting speaking volume samples from multiple participants of a group event (such as a teleconference or an in-person meeting), wherein said speaking volume samples are derived from one or more microphones being used during the group event. Such volume samples can be used, for example, to generate individual speaker volume models. Additionally, such a collecting step can include collecting said speaking volume samples from the multiple participants of the group event periodically during the group event.

In step 204, for participants who have not yet spoken (and therefore have not yet provided a speaking volume sample) historical models are used. In step 206, for participants who have never spoken (for example, in the presence of the given system embodiment), population speaker volume models are used with corresponding means and standard deviations. By way of example, if the gender of the participant can be recognized, gender-based population models can be used.

Step 208 includes creating one or more aggregate models of all speakers in the group event (call) as well as standard deviations and volume estimates. Over time, at least one embodiment of the invention includes modelling the population that has been recorded/sampled to obtain a mean volume and standard deviation in decibels. The (mean) volume of a given individual can then be represented as $\mu+k\sigma$, wherein $\mu$ is the population mean, $\sigma$ is the standard deviation, and k is a positive or negative real number. The one or more volume models can include an historical model comprising prior speaking volume samples attributed to one or more of the multiple participants. Additionally, the one or more volume models can include one or more population models comprising prior speaking volume samples attributed to individuals of one or more demographic groups sharing one or more similarities with the multiple participants.

Additionally, at least one embodiment of the invention includes comparing said speaking volume samples to a predetermined volume level, wherein said predetermined volume level is based on one or more volume models. Further, at least one embodiment of the invention includes determining which of the one or more microphones is being used by which of the multiple participants during the group event.

Also, step 210 includes determining whether the volume estimate and/or speaking volume sample is above or below the predetermined volume level by more than a given threshold. Step 212 includes automatically reducing a broadcast volume of each audio output device being used in the group event during periods of audio input attributed to each microphone determined as being used by the participants attributed to a speaking volume sample that exceeds the predetermined volume level by more than the given threshold. Step 214 includes foregoing any volume modification to each audio output device being used in the group event during periods of audio input attributed to each microphone determined as being used by the participants attributed to a speaking volume sample that is neither above nor below the predetermined volume level by more than a given threshold. Step 216 includes automatically amplifying a broadcast volume of each audio output device being used in the group event during periods of audio input attributed to each microphone determined as being used by the participants attributed to a speaking volume sample that is below the predetermined volume level by more than a given threshold. The predetermined volume level can include, for example, the mean volume level or median volume level of multiple speaking volume samples contained within the one or more volume models. Additionally, the given threshold can include a predetermined number of standard deviations.

The techniques depicted in FIG. 2 can also include automatically reducing the volume of each of the microphones not being used in conjunction with said automatically amplifying the volume of each determined microphone being used by each of the participants attributed to a speaking volume sample that is below the predetermined volume level by more than the given threshold. Additionally, at least one embodiment of the invention can include identifying one or more items of non-speaking noise in the speaking volume samples collected from the multiple participants of the group event, and incorporating the one or more identified items of non-speaking noise in the one or more volume models to be used in said comparing step for the participants attributed to the speaking volume samples containing the one or more identified items of non-speaking noise. Further, the techniques depicted in FIG. 2 can be embodied in software and provided as a service in a cloud environment.

The techniques depicted in FIG. 2 can also, as described herein, include providing a system, wherein the system includes distinct software modules, each of the distinct software modules being embodied on a tangible computer-readable recordable storage medium. All of the modules (or any subset thereof) can be on the same medium, or each can be on a different medium, for example. The modules can include any or all of the components shown in the figures and/or described herein. In an embodiment of the invention, the modules can run, for example, on a hardware processor. The method steps can then be carried out using the distinct software modules of the system, as described above, executing on a hardware processor. Further, a computer program product can include a tangible computer-readable recordable storage medium with code adapted to be executed to carry out at least one method step described herein, including the provision of the system with the distinct software modules.

Additionally, the techniques depicted in FIG. 2 can be implemented via a computer program product that can include computer useable program code that is stored in a computer readable storage medium in a data processing system, and wherein the computer useable program code was downloaded over a network from a remote data processing system. Also, in an embodiment of the invention, the computer program product can include computer useable program code that is stored in a computer readable storage medium in a server data processing system, and wherein the computer useable program code is downloaded over a network to a remote data processing system for use in a computer readable storage medium with the remote system.

An embodiment of the invention or elements thereof can be implemented in the form of an apparatus including a memory and at least one processor that is coupled to the memory and configured to perform exemplary method steps.

Figure 3:
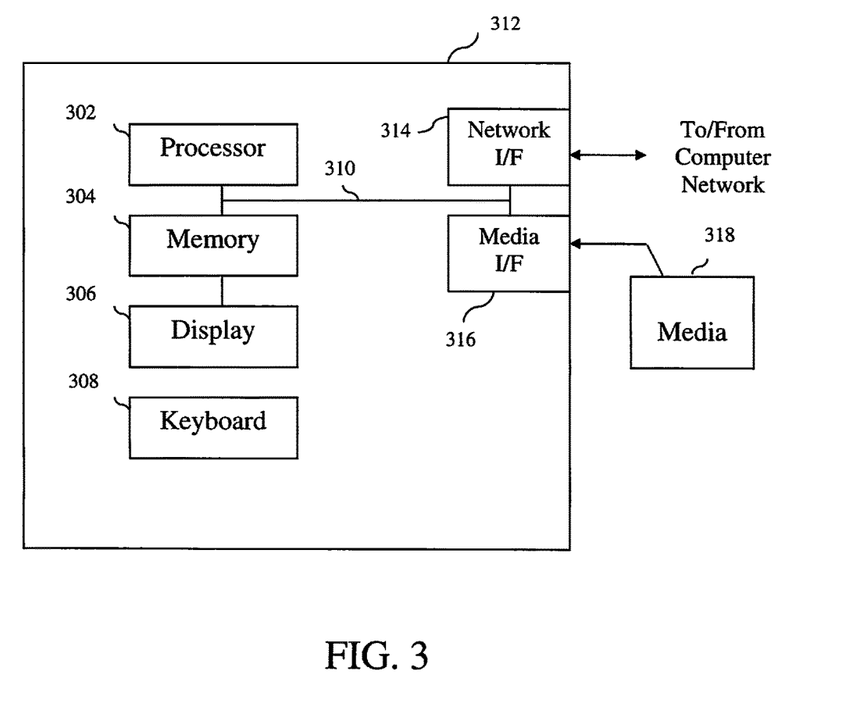
FIG. 3 is a system diagram of an exemplary computer system on which at least one embodiment of the invention can be implemented.

Additionally, an embodiment of the present invention can make use of software running on a computer or workstation. With reference to FIG. 3, such an implementation might employ, for example, a processor 302, a memory 304, and an input/output interface formed, for example, by a display 306 and a keyboard 308. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, a mechanism for inputting data to the processing unit (for example, mouse), and a mechanism for providing results associated with the processing unit (for example, printer). The processor 302, memory 304, and input/output interface such as display 306 and keyboard 308 can be interconnected, for example, via bus 310 as part of a data processing unit 312. Suitable interconnections, for example via bus 310, can also be provided to a network interface 314, such as a network card, which can be provided to interface with a computer network, and to a media interface 316, such as a diskette or CD-ROM drive, which can be provided to interface with media 318.

Accordingly, computer software including instructions or code for performing the methodologies of the invention, as described herein, may be stored in associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 302 coupled directly or indirectly to memory elements 304 through a system bus 310. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including, but not limited to, keyboards 308, displays 306, pointing devices, and the like) can be coupled to the system either directly (such as via bus 310) or through intervening I/O controllers (omitted for clarity).

Network adapters such as network interface 314 may also be coupled to the system to enable the data processing system to become coupled to other data processing systems or remote printers or storage devices through intervening private or public networks. Modems, cable modems and Ethernet cards are just a few of the currently available types of network adapters.

As used herein, including the claims, a "server" includes a physical data processing system (for example, system 312 as shown in FIG. 3) running a server program. It will be understood that such a physical server may or may not include a display and keyboard.

The present invention may be a system, a method, and/or a computer program product at any possible technical detail level of integration. The computer program product may include a computer readable storage medium (or media) having computer readable program instructions thereon for causing a processor to carry out embodiments of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform embodiments of the present invention.

Embodiments of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It should be noted that any of the methods described herein can include an additional step of providing a system comprising distinct software modules embodied on a computer readable storage medium; the modules can include, for example, any or all of the components detailed herein. The method steps can then be carried out using the distinct software modules and/or sub-modules of the system, as described above, executing on a hardware processor 302. Further, a computer program product can include a computer-readable storage medium with code adapted to be implemented to carry out at least one method step described herein, including the provision of the system with the distinct software modules.

In any case, it should be understood that the components illustrated herein may be implemented in various forms of hardware, software, or combinations thereof, for example, application specific integrated circuit(s) (ASICS), functional circuitry, an appropriately programmed digital computer with associated memory, and the like. Given the teachings of the invention provided herein, one of ordinary skill in the related art will be able to contemplate other implementations of the components of the invention.

Additionally, it is understood in advance that implementation of the teachings recited herein are not limited to a particular computing environment. Rather, embodiments of the present invention are capable of being implemented in conjunction with any type of computing environment now known or later developed.

For example, cloud computing is a model of service delivery for enabling convenient, on-demand network access to a shared pool of configurable computing resources (for example, networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (for example, country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (for example, storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (for example, web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (for example, host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (for example, mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (for example, cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 4:
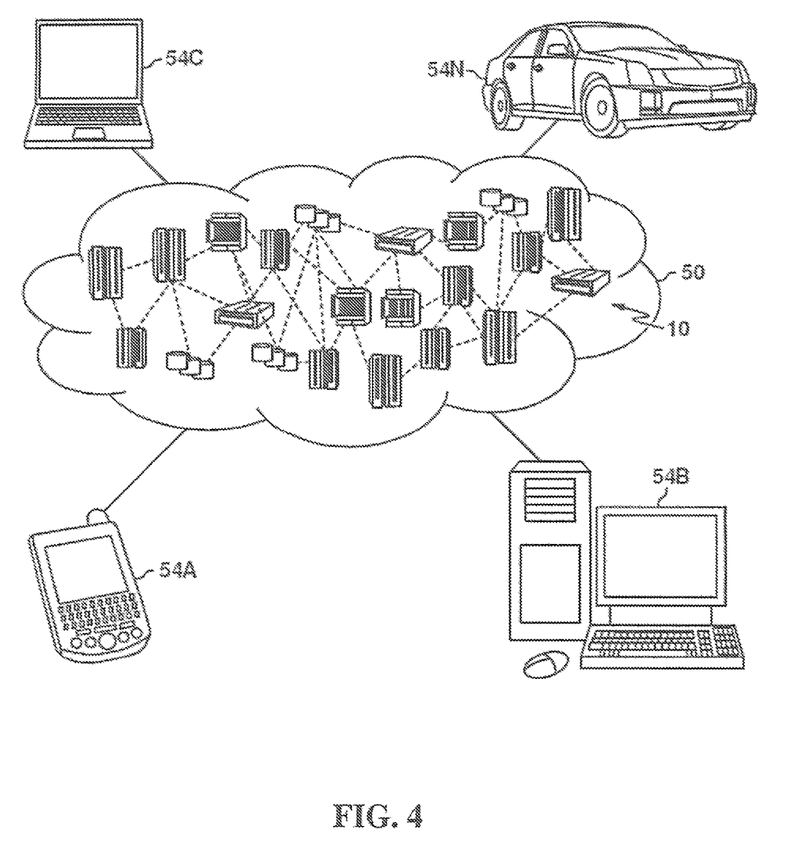
FIG. 4 depicts a cloud computing environment according to an embodiment of the present invention.

Referring now to FIG. 4, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 4 are intended to be illustrative only and that computing nodes 10 and cloud computing environment 50 can communicate with any type of computerized device over any type of network and/or network addressable connection (e.g., using a web browser).

Figure 5:
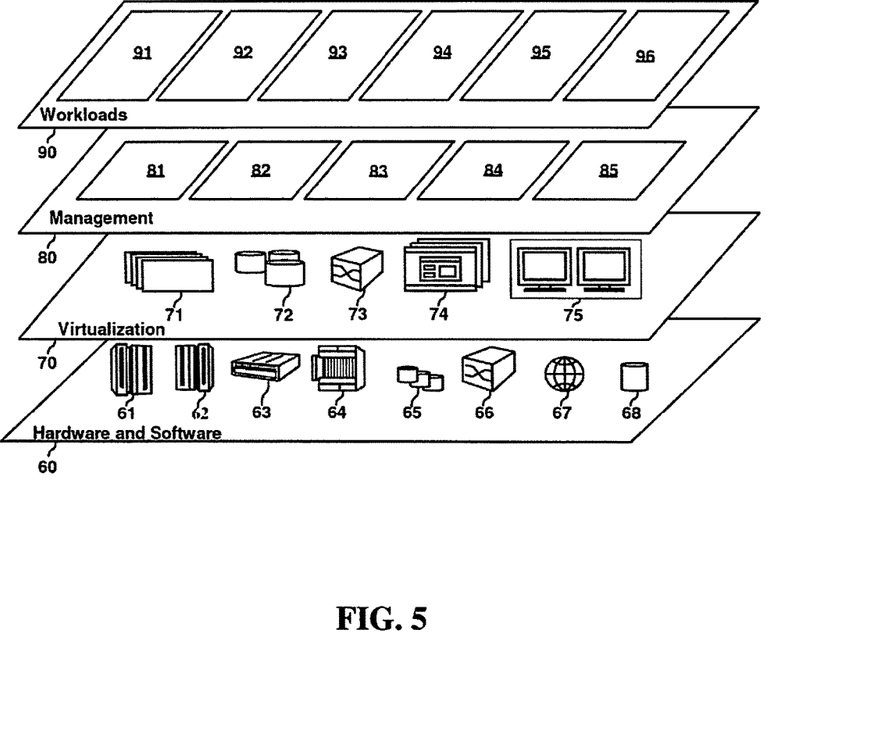
FIG. 5 depicts abstraction model layers according to an embodiment of the present invention.

Referring now to FIG. 5, a set of functional abstraction layers provided by cloud computing environment 50 (FIG. 4) is shown. It should be understood in advance that the components, layers, and functions shown in FIG. 5 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components, include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74 and virtual clients 75. In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources.

In one example, these resources may include application software licenses. Security provides identity verification for cloud consumers and tasks, as well as protection for data and other resources. User portal 83 provides access to the cloud computing, environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and normalizing the speaking volume of multiple participants 96, in accordance with the one or more embodiments of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of another feature, step, operation, element, component, and/or group thereof.

At least one embodiment of the present invention may provide a beneficial effect such as, for example, dynamically amplifying the volume of the softly speaking participants in a meeting, while reducing the volume of loudly speaking participants.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method, comprising:
   collecting speaking volume samples from multiple participants of a group event, wherein said speaking volume samples are derived from one or more microphones being used during the group event, and wherein said collecting comprises collecting said speaking volume samples from the multiple participants of the group event periodically during the group event;
   comparing said speaking volume samples to a predetermined volume level, wherein said predetermined volume level is based on one or more volume models;
   determining which of the one or more microphones is being used by which of the multiple participants during the group event;
   automatically amplifying a broadcast volume of each audio output device being used in the group event during periods of audio input attributed to each microphone determined as being used by the participants attributed to a speaking volume sample that is below the predetermined volume level by more than a given threshold; and
   automatically reducing a broadcast volume of each audio output device being used in the group event during periods of audio input attributed to each microphone determined as being used by the participants attributed to a speaking volume sample that exceeds the predetermined volume level by more than the given threshold.

2. The computer-implemented method of claim 1, wherein the group event comprises a teleconference.

3. The computer-implemented method of claim 1, wherein the group event comprises an in-person meeting.

4. The computer-implemented method of claim 1, wherein the one or more volume models comprises an historical model comprising prior speaking volume samples attributed to one or more of the multiple participants.

5. The computer-implemented method of claim 1, wherein the one or more volume models comprise one or more population models comprising prior speaking volume samples attributed to individuals of one or more demographic groups sharing one or more similarities with the multiple participants.

6. The computer-implemented method of claim 1, wherein the predetermined volume level comprises the mean volume level of multiple speaking volume samples contained within the one or more volume models.

7. The computer-implemented method of claim 1, wherein the predetermined volume level comprises the median volume level of multiple speaking volume samples contained within the one or more volume models.

8. The computer-implemented method of claim 1, wherein the given threshold comprises a predetermined number of standard deviations.

9. The computer-implemented method of claim 1, comprising:
automatically reducing the volume of each of the microphones not being used in conjunction with said automatically amplifying the volume of each determined microphone being used by each of the participants attributed to a speaking volume sample that is below the predetermined volume level by more than the given threshold.

10. The computer-implemented method of claim 1, comprising:
identifying one or more items of non-speaking noise in the speaking volume samples collected from the multiple participants of the group event.

11. The computer-implemented method of claim 10, comprising:
incorporating the one or more identified items of non-speaking noise in the one or more volume models to be used in said comparing step for the participants attributed to the speaking volume samples containing the one or more identified items of non-speaking noise.

12. The computer-implemented method of claim 1, wherein software is provided as a service in a cloud environment.

13. A computer program product comprising a computer readable storage medium having program instructions embodied therewith, the program instructions executable by a device to cause the device to:
collect speaking volume samples from multiple participants of a group event, wherein said speaking volume samples are derived from one or more microphones being used during the group event, and wherein said collecting comprises collecting said speaking volume samples from the multiple participants of the group event periodically during the group event;
compare said speaking volume samples to a predetermined volume level, wherein said predetermined volume level is based on one or more volume models;
determine which of the one or more microphones is being used by which of the multiple participants during the group event;
automatically amplify a broadcast volume of each audio output device being used in the group event during periods of audio input attributed to each microphone determined as being used by the participants attributed to a speaking volume sample that is below the predetermined volume level by more than a given threshold; and
automatically reduce a broadcast volume of each audio output device being used in the group event during periods of audio input attributed to each microphone determined as being used by the participants attributed to a speaking volume sample that exceeds the predetermined volume level by more than the given threshold.

14. The computer program product of claim 13, wherein the program instructions executable by a computing device further cause the computing device to:
automatically reduce the volume of each of the microphones not being used in conjunction with said automatically amplifying the volume of each determined microphone being used by each of the participants attributed to a speaking volume sample that is below the predetermined volume level by more than the given threshold.

15. The computer program product of claim 13, wherein the program instructions executable by a computing device further cause the computing device to:
identify one or more items of non-speaking noise in the speaking volume samples collected from the multiple participants of the group event.

16. The computer program product of claim 15, wherein the program instructions executable by a computing device further cause the computing device to:
incorporate the one or more identified items of non-speaking noise in the one or more volume models to be used in said comparing step for the participants attributed to the speaking volume samples containing the one or more identified items of non-speaking noise.

17. A system comprising:
a memory; and
at least one processor operably coupled to the memory and configured for:
collecting speaking volume samples from multiple participants of a group event, wherein said speaking volume samples are derived from one or more microphones being used during the group event, and wherein said collecting comprises collecting said speaking volume samples from the multiple participants of the group event periodically during the group event;
comparing said speaking volume samples to a predetermined volume level, wherein said predetermined volume level is based on one or more volume models;
determining which of the one or more microphones is being used by which of the multiple participants during the group event;
automatically amplifying a broadcast volume of each audio output device being used in the group event during periods of audio input attributed to each microphone determined as being used by the participants attributed to a speaking volume sample that is below the predetermined volume level by more than a given threshold; and
automatically reducing a broadcast volume of each audio output device being used in the group event during periods of audio input attributed to each microphone determined as being used by the participants attributed to a speaking volume sample that exceeds the predetermined volume level by more than the given threshold.

18. The system of claim 17, wherein the at least one processor is further configured for:
automatically reducing the volume of each of the microphones not being used in conjunction with said automatically amplifying the volume of each determined microphone being used by each of the participants attributed to a speaking volume sample that is below the predetermined volume level by more than the given threshold.

19. The system of claim 17, wherein the at least one processor is further configured for:
identifying one or more items of non-speaking noise in the speaking volume samples collected from the multiple participants of the group event; and
incorporating the one or more identified items of non-speaking noise in the one or more volume models to be used in said comparing step for the participants attributed to the speaking volume samples containing the one or more identified items of non-speaking noise.

* * * * *